US012626749B2

(12) United States Patent　(10) Patent No.:　US 12,626,749 B2
Moon et al.　(45) Date of Patent:　***May 12, 2026

(54) MEMORY DEVICE ADJUSTING DUTY CYCLE AND MEMORY SYSTEM HAVING THE SAME

(71) Applicant: SAMSUNG ELECTRONICS CO., LTD., Suwon-si (KR)

(72) Inventors: Dae-Sik Moon, Suwon-si (KR); Gil-Hoon Cha, Hwaseong-si (KR); Ki-Seok Oh, Seoul (KR); Chang-Kyo Lee, Seoul (KR); Yeon-Kyu Choi, Seoul (KR); Jung-Hwan Choi, Hwaseong-si (KR); Kyung-Soo Ha, Hwaseong-si (KR); Seok-Hun Hyun, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/817,678

(22) Filed: Aug. 28, 2024

(65) Prior Publication Data

US 2024/0420754 A1　Dec. 19, 2024

Related U.S. Application Data

(63) Continuation of application No. 18/330,527, filed on Jun. 7, 2023, now Pat. No. 12,106,794, which is a (Continued)

(30) Foreign Application Priority Data

Jan. 31, 2018　(KR) ........................ 10-2018-0012423
May 30, 2018　(KR) ........................ 10-2018-0062094

(51) Int. Cl.
*G11C 11/40*　(2006.01)
*G06F 3/06*　(2006.01)
(Continued)

(52) U.S. Cl.
CPC ........ *G11C 11/4076* (2013.01); *G06F 3/0604* (2013.01); *G06F 3/0653* (2013.01);
(Continued)

(58) Field of Classification Search
CPC .............. G11C 11/4076; G11C 11/409; G11C 11/4063; G11C 7/222; G06F 3/0604;
(Continued)

(56) References Cited

U.S. PATENT DOCUMENTS 6,281,718 B1　8/2001　Page et al.
6,933,759 B1　8/2005　Wu et al.
(Continued)

FOREIGN PATENT DOCUMENTS

CN　　1983440　　6/2007
CN　　102790603　　11/2012
(Continued)

OTHER PUBLICATIONS

European Search Report dated Jun. 26, 2019 in corresponding European Patent Application No. 19152774.6.
(Continued)

*Primary Examiner* — Hiep T Nguyen
(74) *Attorney, Agent, or Firm* — Morgan, Lewis & Bockius LLP

(57)　ABSTRACT

A memory device includes a clock receiver configured to receive, from a memory controller, a write clock that is used to receive write data during a data write operation, a duty monitor configured to generate first monitoring information by monitoring a duty of the write clock, and a duty adjuster configured to adjust the duty of the write clock in response
(Continued)

to a duty control signal and output an adjusted write clock. The memory device provides the first monitoring information to the memory controller, and receives the duty control signal, generated using the first monitoring information, from the memory controller.

20 Claims, 14 Drawing Sheets

Related U.S. Application Data continuation of application No. 18/314,243, filed on May 9, 2023, now Pat. No. 12,033,686, which is a continuation of application No. 17/816,138, filed on Jul. 29, 2022, now Pat. No. 11,749,338, which is a continuation of application No. 17/807,163, filed on Jun. 16, 2022, now Pat. No. 11,749,337, which is a continuation of application No. 17/564,564, filed on Dec. 29, 2021, now Pat. No. 11,423,971, which is a continuation of application No. 17/148,915, filed on Jan. 14, 2021, now Pat. No. 11,393,522, which is a continuation of application No. 16/230,185, filed on Dec. 21, 2018, now Pat. No. 10,923,175.

(51) Int. Cl.
| | |
|---|---|
| *G11C 7/22* | (2006.01) |
| *G11C 11/4076* | (2006.01) |
| *G11C 11/409* | (2006.01) |

(52) U.S. Cl.
CPC .......... *G06F 3/0659* (2013.01); *G06F 3/0673* (2013.01); *G11C 7/222* (2013.01); *G11C 11/409* (2013.01)

(58) Field of Classification Search
CPC .... G06F 3/0653; G06F 3/0659; G06F 3/0673; H03K 3/017
See application file for complete search history.

(56) References Cited

U.S. PATENT DOCUMENTS

| | | | |
|---|---|---|---|
| 7,417,902 | B2 | 8/2008 | Park et al. |
| 7,994,834 | B2 | 8/2011 | Ku |
| 8,161,313 | B2 | 4/2012 | Oh |
| 8,508,274 | B2 | 8/2013 | Shin |
| 8,644,085 | B2 | 2/2014 | Kim et al. |
| 8,766,691 | B2 | 7/2014 | Choi et al. |
| 9,071,237 | B2 | 6/2015 | Lee et al. |
| 9,263,107 | B1 | 2/2016 | Wayland et al. |
| 9,741,443 | B2 | 8/2017 | Yu et al. |
| 9,785,589 | B2 | 10/2017 | Zerbe et al. |
| 9,831,862 | B2 | 11/2017 | Lim |
| 10,186,309 | B2 | 1/2019 | Oh et al. |
| 10,734,983 | B1 | 8/2020 | Jeter et al. |
| 10,811,064 | B2 | 10/2020 | Kim |
| 10,923,175 | B2 | 2/2021 | Moon et al. |
| 11,393,522 | B2 | 7/2022 | Moon et al. |
| 11,423,971 | B2 | 8/2022 | Moon et al. |
| 11,749,337 | B2 | 9/2023 | Moon et al. |
| 11,749,338 | B2 | 9/2023 | Moon et al. |
| 12,033,686 | B2 | 7/2024 | Moon et al. |
| 12,106,794 | B2 * | 10/2024 | Moon ................... G06F 3/0604 |
| 2002/0070752 | A1 | 6/2002 | Harrison |
| 2004/0022099 | A1 | 2/2004 | Ozawa |
| 2004/0218425 | A1 | 11/2004 | Fukushima |
| 2005/0058233 | A1 | 3/2005 | Nguyen et al. |
| 2006/0152266 | A1 | 7/2006 | Han |
| 2007/0146011 | A1 | 6/2007 | O'Mahony et al. |
| 2011/0267123 | A1 | 11/2011 | Lee |
| 2011/0291725 | A1 | 12/2011 | Shin |
| 2012/0250426 | A1 | 10/2012 | Huang |
| 2013/0051495 | A1 | 2/2013 | Shawwa et al. |
| 2015/0287471 | A1 | 10/2015 | Yu et al. |
| 2016/0172017 | A1 | 6/2016 | King |
| 2017/0364276 | A1 | 12/2017 | Bhuiyan et al. |
| 2018/0005686 | A1 | 1/2018 | Oh et al. |
| 2019/0237127 | A1 | 8/2019 | Moon et al. |
| 2021/0166749 | A1 | 6/2021 | Moon et al. |
| 2022/0122648 | A1 | 4/2022 | Moon et al. |
| 2022/0383931 | A1 | 12/2022 | Moon et al. |
| 2023/0317138 | A1 | 10/2023 | Moon et al. |

FOREIGN PATENT DOCUMENTS

| | | |
|---|---|---|
| CN | 107112052 | 8/2017 |
| CN | 107545915 | 1/2018 |
| KR | 10-2014-0112927 | 9/2014 |
| TW | 201239634 | 10/2012 |
| TW | 201310916 | 3/2013 |
| TW | 201528689 | 7/2015 |
| WO | 2016073119 | 5/2016 |

OTHER PUBLICATIONS

Office Action dated Mar. 5, 2024 in corresponding U.S. Appl. No. 18/330,527.

First Office Action dated Mar. 25, 2023 in corresponding CN Patent Application No. 201910001529.8 (with English translation).

Notice of Allowance Dated Mar. 22, 2022 In Corresponding U.S. Appl. No. 17/148,915.

Notice of Allowance dated May 29, 2023 in corresponding CN Patent Application No. 201910001529.8.

Notice of Allowance dated May 29, 2023 in corresponding CN Patent Application No. 201910001529.8 (English Translation).

Office Action dated Dec. 13, 2022 in corresponding U.S. Appl. No. 17/807,163.

Office Action dated Dec. 14, 2022 in corresponding U.S. Appl. No. 17/816,138.

Office Action Dated Dec. 20, 2023 In Corresponding U.S. Appl. No. 18/314,243.

Office Action dated Mar. 17, 2022 in corresponding U.S. Appl. No. 17/564,564.

Taiwan Office Action dated Jun. 21, 2021 in corresponding Taiwanese Patent Application No. 108102689 (11 pages), in Taiwanese.

Taiwan Search Report dated Jun. 21, 2021 in corresponding Taiwanese Patent Application No. 108102689 (1 page), in Taiwanese.

* cited by examiner

FIG. 12

| OP[n+2] | OP[n+1] | OP[n] | OP[n-1] | OP[n-2] | . . . | OP[0] |
|---|---|---|---|---|---|---|
| DCM result Low duty | DCM result High duty | DCA Polarity | DCA weight | | | |

MEMORY DEVICE ADJUSTING DUTY CYCLE AND MEMORY SYSTEM HAVING THE SAME

CROSS-REFERENCE TO RELATED APPLICATIONS

This application is a continuation of U.S. patent application Ser. No. 18/330,527 filed Jun. 7, 2023, which is a continuation of U.S. patent application Ser. No. 18/314,243 filed May 9, 2023, issued as U.S. Pat. No. 12,033,686 on Jul. 9, 2024, which is a continuation of U.S. patent application Ser. No. 17/816,138 filed Jul. 29, 2022, issued as U.S. Pat. No. 11,749,338 on Sep. 5, 2023, which is a continuation of U.S. patent application Ser. No. 17/807,163 filed Jun. 16, 2022, which issued as U.S. Pat. No. 11,749,337 on Sep. 5, 2023, which is a continuation of U.S. patent application Ser. No. 17/564,564 filed Dec. 29, 2021, issued as U.S. Pat. No. 11,423,971 on Aug. 23, 2022, which is a continuation of U.S. patent application Ser. No. 17/148,915 filed Jan. 14, 2021, issued as U.S. Pat. No. 11,393,522 on Jul. 19, 2022, which is continuation application of U.S. patent application Ser. No. 16/230,185 filed on Dec. 21, 2018, issued as U.S. Pat. No. 10,923,175 on Feb. 16, 2021, which claims priority under 35 U.S.C. § 119 to Korean Patent Application No. 10-2018-0012423, filed on Jan. 31, 2018, and Korean Patent Application No. 10-2018-0062094, filed on May 30, 2018, in the Korean Intellectual Property Office, the disclosures of which are incorporated by reference herein in their entireties.

TECHNICAL FIELD

Exemplary embodiments of the inventive concept relate to memory devices, and more particularly, to a memory device that adjusts a duty cycle of a clock signal, and a memory system including the memory device.

DISCUSSION OF RELATED ART

Memory devices, such as low power double data rate (LPDDR) synchronous dynamic random access memory (SDRAM), may be usually used in various types of electronic apparatuses, such as smartphones, tablet personal computers (PCs), or ultra books.

Memory devices may operate according to various specifications. For example, in the LPDDR specification, memory devices may receive, from a memory controller, a write clock that synchronizes with write data, or may provide a read clock to the memory controller in synchronization with read data. Memory systems including such memory devices may need to efficiently manage duty errors of the write clock and the read clock.

SUMMARY

According to an exemplary embodiment of the inventive concept, a memory device includes a clock receiver configured to receive, from a memory controller, a write clock that is used to receive write data during a data write operation, a duty monitor configured to generate first monitoring information by monitoring a duty of the write clock, and a duty adjuster configured to adjust the duty of the write clock in response to a duty control signal and output an adjusted write clock. The memory device provides the first monitoring information to the memory controller, and receives the duty control signal, generated using the first the monitoring information, from the memory controller.

According to an exemplary embodiment of the inventive concept, a memory device includes a clock receiver configured to receive a clock signal from a memory controller, a first duty adjuster configured to receive the clock signal from the clock receiver and perform a duty adjustment on the received clock signal, a clock tree configured to generate one or more write clocks that are used to receive the write data, by using the clock signal received from the first duty adjuster, one or more data receivers each configured to receive the write data in synchronization with each of the one or more write clocks, one or more second duty adjusters arranged in correspondence with the one or more data receivers and configured to adjust duties of the one or more write clocks that are provided to the one or more data receivers, and a duty monitor configured to monitor a duty of at least one of the clock signal and the one or more write clocks, and provide first monitoring information, as a result of the monitoring, to the memory controller.

According to an exemplary embodiment of the inventive concept, in a memory system including a memory controller, the memory controller includes one or more data transmitters configured to output write data, a write clock transmitter configured to output a write clock in synchronization with the write data, and a duty controller configured to receive, from an external source, first monitoring information representing a result of monitoring a duty of the write clock, determine, based on the first monitoring information, whether the write clock provided to the external source has a duty error, and generate a first duty control signal that is used to adjust the duty of the write clock output to the external source.

According to an exemplary embodiment of the inventive concept, a memory system includes a memory controller configured to transmit a write clock, write data, and a control command for controlling a monitoring operation and duty adjust operations, and a memory device. The memory device includes a signal transmission/reception block configured to receive the write clock and the write data, and to transmit read data and a read clock, a duty adjuster block including a plurality a duty adjusters configured to perform the duty adjust operations and connected to the signal transmission/reception block, a clock tree configured to receive the write clock via the duty adjuster block, and transmit the write clock and the read clock based on the write clock to a plurality of nodes in the memory device; and a first duty monitor configured to perform the monitoring operation to monitor a duty of the write clock applied to at least one of the plurality of nodes and generate first monitoring information.

BRIEF DESCRIPTION OF THE DRAWINGS

The above and other features of the inventive concept will be more clearly understood by describing in detail exemplary embodiments thereof with reference to the accompanying drawings.

FIG. 12 is a table illustrating information stored in an MRS according to an exemplary embodiment of the inventive concept.

DETAILED DESCRIPTION OF THE EMBODIMENTS

Figure 1:
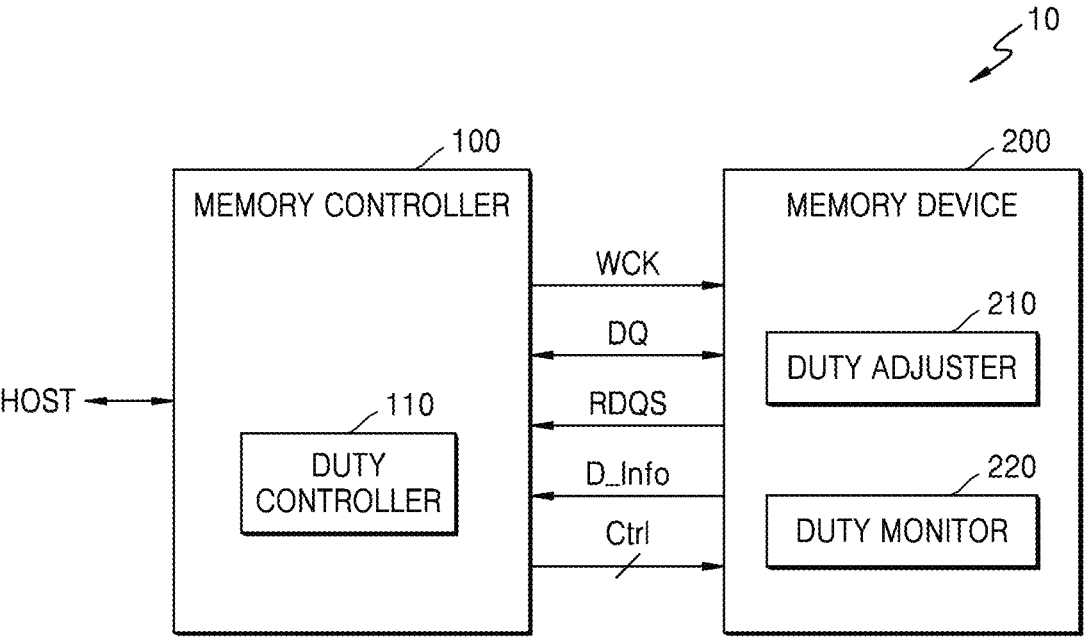
FIG. 1 is a block diagram of a memory system including a memory device, according to an exemplary embodiment of the inventive concept.

Exemplary embodiments of the inventive concept provide a memory device capable of efficiently adjusting a duty cycle and improving the performance of a memory system, and a memory system including the memory device.

Exemplary embodiments of the inventive concept will now be described more fully with reference to the accompanying drawings. Like reference numerals may refer to like elements throughout this application.

FIG. 1 is a block diagram of a memory system including a memory device, according to an exemplary embodiment of the inventive concept.

Referring to FIG. 1, a memory system 10 may include a memory controller 100 and a memory device 200. The memory system 10 may be included in a personal computer (PC) or a mobile electronic apparatus. The mobile electronic apparatus may be implemented using a laptop computer, a mobile telephone, a smartphone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile Internet device (MID), a wearable computer, an Internet of Things (IoT) device, an Internet of Everything (IoE) device, or a drone.

The memory controller 100 may be implemented using a system on chip (SoC), an application processor (AP), a mobile AP, a chipset, or a group of chips. For example, the memory controller 100 may be a semiconductor device that performs a memory control function, or may be a component included in an AP. For example, the AP may include the memory controller 100, random access memory (RAM), a central processing unit (CPU), a graphics processing unit (GPU), and/or a modem.

The memory device 200 may be implemented using a volatile memory device. The volatile memory device may be implemented using RAM, dynamic RAM (DRAM), or static RAM (SRAM), but the inventive concept is not limited thereto. For example, the memory device 200 may be double data rate synchronous dynamic random access memory (DDR SDRAM), low power double data rate (LPDDR) SDRAM, graphics double data rate (GDDR) SDRAM, rambus dynamic random access memory (RDRAM), or the like. Alternatively, the memory device 200 may be implemented using a high bandwidth memory (HBM).

The memory device 200 may be implemented using a non-volatile memory device. For example, the memory device 200 may be implemented using a resistive memory, such as phase change RAM (PRAM), magnetic RAM (MRAM), or resistive RAM (RRAM).

Referring to FIG. 1, the memory controller 100 may include a duty controller 110. The memory device 200 may include at least one duty adjuster (or a duty cycle adjustor) 210 and a duty monitor 220. The duty cycle adjustor may also be referred to as a duty cycle actuator. The memory device 200 may include various components for memory operations, such as writing and reading of data. For example, the memory device 200 may further include a memory cell array and its peripheral circuits. The peripheral circuits are various components for memory operations, and thus may include various types of circuits, such as a command decoder, a row decoder, a column decoder, and a data input/output circuit.

In response to a write/read request from a host HOST, the memory controller 100 may control the memory device 200 such that data DQ is read from the memory device 200 or written to the memory device 200. In detail, the memory controller 100 may control read and write operations of the data DQ with respect to the memory device 200, by providing an address and a command to the memory device 200. Write data DQ and read data DQ may be transmitted or received between the memory controller 100 and the memory device 200.

The memory controller 100 may provide a clock signal, for use in a data write and/or read operation, to the memory device 200. Because the memory device 200 receives the write data DQ by using the clock signal received from the memory controller 100, the clock signal may be referred to as a write clock WCK. The memory device 200 may perform signal processing with respect to the write clock WCK received from the memory controller 100, and thus an internal write clock may be generated and used during reception or outputting of actual data DQ.

According to exemplary embodiments of the inventive concept, an operation of monitoring the duty of the write clock WCK may correspond to an operation of monitoring the duty of a clock signal that is applied to various nodes in the memory device 200. For example, the internal write clock generated based on the write clock WCK may be monitored. For example, the internal write clock may be generated such that at least one of a frequency and a phase of the internal write clock is different from the write clock WCK. A plurality of internal write clocks may be generated based on the write clock WCK and may be used to receive one bit of data, and a duty monitoring operation may be performed with respect to the plurality of internal write clocks.

In other words, according to an exemplary embodiment of the inventive concept, the duty of the write clock WCK provided by the memory controller 100 may be determined by monitoring the duty of the internal write clock. Duty monitoring operations according to exemplary embodiments of the inventive concept may be understood as monitoring the duties of various types of clock signals, such as the write clock WCK provided to the memory device 200 or the internal write clock generated by the memory device 200. In other words, according to exemplary embodiments of the inventive concept, the write clock WCK may be interchangeably used with the internal write clock.

For example, during a data write operation, the memory device 200 may receive write data DQ together with the write clock WCK, in synchronization with the write clock WCK, and a data receiver within the memory device 200 may receive or latch the write data DQ by using the write clock WCK. During a data read operation, the memory device 200 may internally generate a read clock RDQS. For example, the memory device 200 may generate the read clock RDQS, based on the write clock WCK. The memory device 200 may transmit the read data DQ to the memory controller 100, in synchronization with the read clock RDQS.

To improve reception performance of the write data DQ within the memory device 200, the duty of the write clock WCK for use in latching the write data DQ needs to be optimized. For example, the duty of the write clock WCK provided by the memory controller 100 may be deformed due to an influence of a channel between the memory controller 100 and the memory device 200 or duty distortion generated within the memory device 200, and reception performance of the write data DQ may be degraded due to the deformed duty.

According to an exemplary embodiment of the inventive concept, at least some operations for adjusting the duty of the write clock WCK and/or the read clock RDQS may be performed in the memory controller 100. For example, the write clock WCK and the read clock RDQS may be used to align data DQ that is input and output, and duty adjustment of the write clock WCK and/or the read clock RDQS may be performed by the duty adjuster 210 within the memory device 200. The duty of the write clock WCK and/or the read clock RDQS may be monitored by the duty monitor 220 (for example, a simple monitor circuit, such as shmoo) within the memory device 200, and monitoring information D_Info may be provided from the memory device 200 to the memory controller 100.

For example, the duty adjuster 210 may adjust the duty of the write clock WCK provided by the memory controller 100, and the duty monitor 220 may monitor the duty of the write clock WCK that is applied to at least one node in the memory device 200. The duty monitoring may include an operation of detecting a ratio (for example, a duty ratio) between a logic high section and a logic low section of the write clock WCK, and the duty monitor 220 may generate the monitoring information D_Info corresponding to the detected duty ratio of the write clock WCK. In other words, the duty monitor 220 may generate the monitoring information D_Info of which a value is changed as the duty ratio of the write clock WCK is changed. According to an exemplary embodiment of the inventive concept, the monitoring information D_Info may have a digital value including a plurality of bits, and the digital value of the monitoring information D_Info may be changed according to a result of monitoring the duty of the write clock WCK.

When the duty adjuster 210 adjusts the duty of the read clock RDQS that is provided to the memory controller 100, the duty monitor 220 may monitor the duty of the read clock RDQS that is applied to the at least one node within the memory device 200. According to an exemplary embodiment of the inventive concept, the memory device 200 may generate at least one read clock RDQS by using the write clock WCK received from the memory controller 100, and the duty monitor 220 may monitor the duty of the generated read clock RDQS and may generate the monitoring information D_Info as a result of the monitoring.

The duty controller 110 of the memory controller 100 may determine whether the duty of the write clock WCK and/or the read clock RDQS needs to be adjusted based on the monitoring information D_Info. For example, when the duty of the write clock WCK and/or the read clock RDQS is not appropriate to receive or transmit the data DQ, it may be determined that there is a duty error, and the duty controller 110 may provide, to the memory device 200, a control signal Ctrl for minimizing the duty error. The control signal Ctrl may be provided to the duty adjuster 210 within the memory device 200, and the duty adjuster 210 may adjust the duty of the write clock WCK and/or the read clock RDQS in response to the control signal Ctrl.

According to an exemplary embodiment of the inventive concept, at least some functions for duty adjustment may be performed by the memory controller 100. For example, according to the LPDDR5 specification of DRAM, a duty error or duty cycle error of the write clock WCK operating at high speed is not processed within the DRAM, and a path capable of monitoring, comparison, and control (duty cycle adjustor DCA) via the memory controller 100 is provided, and thus, the total performance of the memory system 10 may be increased.

Although both duty adjustments with respect to the write clock WCK and the read clock RDQS have been performed by a single device in FIG. 1, the respective duties of the write clock WCK and the read clock RDQS may be independently controlled via independent duty adjusters. The write clock WCK or the read clock RDQS of FIG. 1 may also be referred to as a data strobe signal in the memory system 10, and the duty of the data strobe signal is monitored.

When the memory device 200 internally processes a duty error, the memory controller 100 has a limit in controlling the duty of the write clock WCK and/or the read clock RDQS, and it may be impossible to check an internal margin. However, these problems may be addressed, which will be described in detail below.

Figure 2:
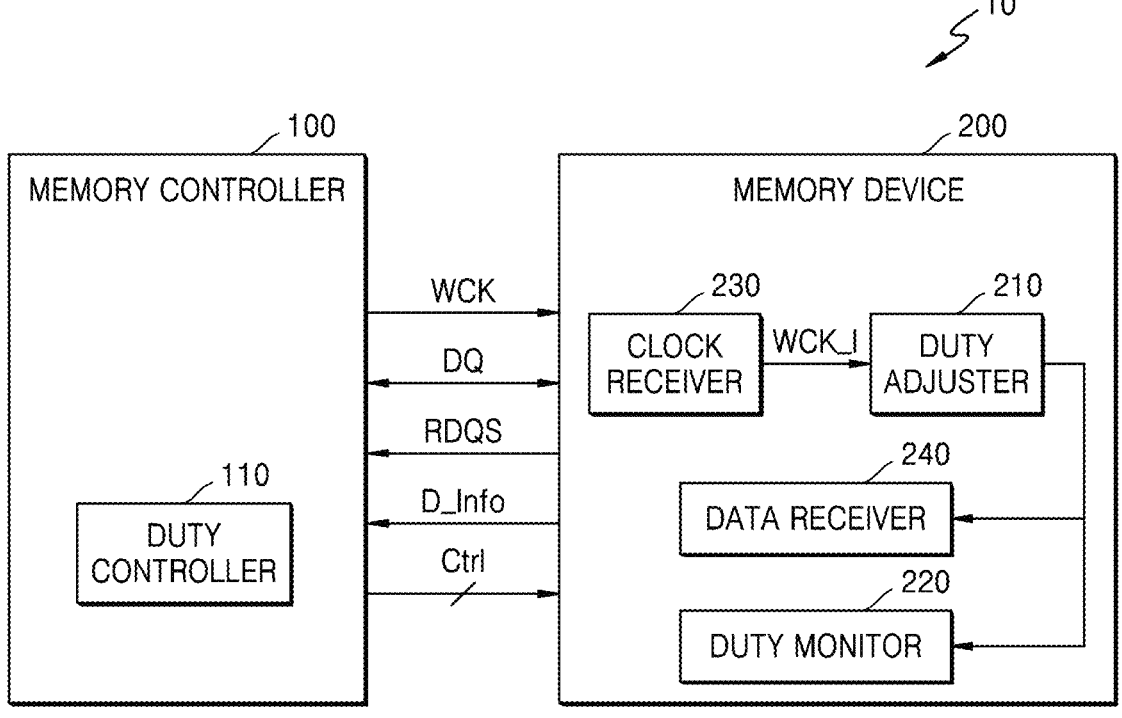
FIG. 2 is a block diagram illustrating an operation of the memory system of FIG. 1 according to an exemplary embodiment of the inventive concept.

FIG. 2 is a block diagram illustrating an operation of the memory system of FIG. 1 according to an exemplary embodiment of the inventive concept. Descriptions of a structure and an operation of the memory system 10 shown in FIG. 2 that are the same as or similar to those provided with reference to FIG. 1 will be omitted. FIG. 2 illustrates duty monitoring and duty adjustment operations included in a data write operation, and also illustrates, as independent components, the write clock WCK provided from the memory controller 100 and an internal write clock WCK_I generated within the memory device 200.

Referring to FIGS. 1 and 2, the memory device 200 may include the duty adjuster 210, the duty monitor 220, a clock receiver 230, and a data receiver 240. The clock receiver 230 may receive from the memory controller 100 the write clock WCK that synchronizes with the write data DQ and may transmit the internal write clock WCK_I to internal circuits within the memory device 200. For example, the clock receiver 230 may generate the internal write clock WCK_I via internal signal processing on the write clock WCK from the memory controller 100.

The internal write clock WCK_I generated by the clock receiver 230 may be provided to the duty adjuster 210. The duty adjuster 210 may adjust a duty of the internal write clock WCK_I and provide a duty-adjusted internal write clock WCK_I to the data receiver 240. The data receiver 240 may receive the write data DQ in synchronization with the internal write clock WCK_I.

The duty monitor 220 may receive the internal write clock WCK_I from the duty adjuster 210. The internal write clock WCK_I may be transmitted via various paths within the memory device 200. According to an exemplary embodiment of the inventive concept, the duty monitor 220 may be electrically connected to an input end of the data receiver 240 and may monitor the duty of the internal write clock WCK_I that is provided to the data receiver 240.

According to an exemplary embodiment of the inventive concept, the write data DQ may include a plurality of bits, and the data receiver 240 may include a plurality of reception circuits in correspondence with the plurality of bits. The duty adjuster 210 may include a plurality of duty adjusters in correspondence with the plurality of reception circuits. The internal write clock WCK_I may be provided to each of the plurality of duty adjusters. At this time, the duty monitor 220 may monitor duties of at least some of the internal write clocks WCK_I that are provided to the plurality of duty adjusters. In other words, the duty monitor 220 may generate a plurality of pieces of the monitoring information D_Info corresponding to the plurality of duty adjusters, and may provide the generated plurality of pieces of the monitoring information D_Info to the memory controller 100.

According to the exemplary embodiment of FIG. 2, a feedback path may be formed between the memory controller 100 and the memory device 200, and may include a path via which the monitoring information D_Info is transmitted. For example, the duty of the write clock WCK output by the memory controller 100 may be monitored based on the internal write clock WCK_I within the memory device 200, and a monitoring result may be provided to the memory controller 100.

According to the exemplary embodiment of FIGS. 1 and 2, the memory controller 100 may determine a duty state of the write clock WCK that is used in the memory device 200, and a control operation for adjusting the duty of the write clock WCK (for example, an operation of generating a control signal for controlling duty adjustment) may be performed by the memory controller 100. In this case, the memory controller 100 may determine the necessity of adjusting the duty of the write clock WCK, and accordingly may control the memory device 200 to selectively perform a duty adjust operation. For example, the memory controller 100 may enable or disable the duty adjust operation of the memory device 200, and, when the duty adjust operation of the memory device 200 is disabled, power consumed for duty adjustment may be reduced.

According to such an exemplary embodiment of the inventive concept, a duty adjuster (or a duty cycle actuator) enabling duty error corrections of the write clock WCK and the read clock RDQS may be included in a memory device, and duty error information (or information obtained by duty monitoring) of the write clock WCK and the read clock RDQS may be provided to a memory controller via a feedback path. The memory controller may perform a comparison operation based on received monitoring information (for example, a comparison operation for determining whether duty adjustment is needed), and may generate a control signal for controlling the duty adjuster to minimize a duty error.

Figure 3:
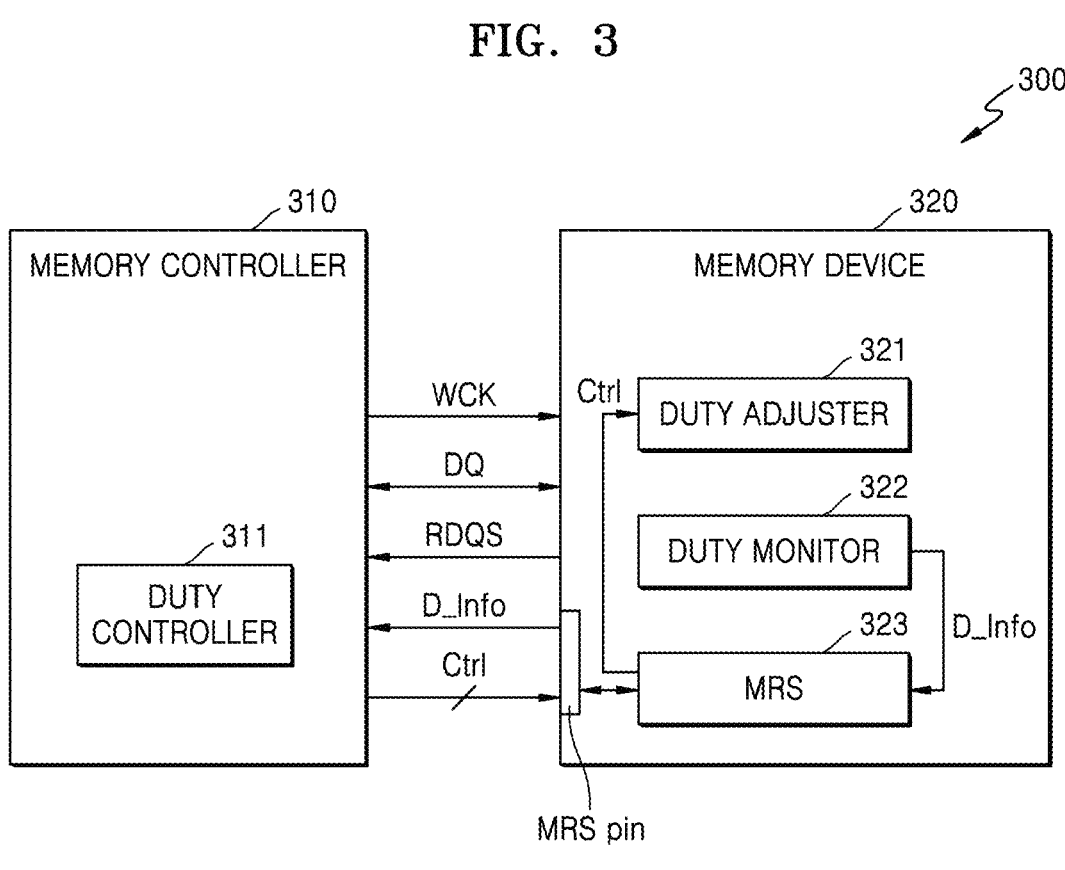
FIG. 3 is a block diagram of a memory system using a mode register set (MRS), according to an exemplary embodiment of the inventive concept.

FIG. 3 is a block diagram of a memory system using a mode register set (MRS), according to an exemplary embodiment of the inventive concept.

Referring to FIG. 3, a memory system 300 may include a memory controller 310 and a memory device 320, and the memory controller 310 may include a duty controller 311. The memory device 320 may include a duty adjuster 321, a duty monitor 322, and an MRS 323. Detailed operations of the duty controller 311, the duty adjuster 321, and the duty monitor 322 are the same as or similar to those in the above-described exemplary embodiments of the inventive concept, and thus detailed descriptions thereof will be omitted.

Various signals may be transmitted or received between the memory controller 310 and the memory device 320 via various paths. For example, the memory device 320 may transmit the monitoring information D_Info to the memory controller 310 by using a pin defined in an LPDDRx specification, such as LPDDR4 or LPDDR5. For example, the monitoring information D_Info may be provided to the memory controller 310 via at least one pin selected from among a plurality of pins defined in the LPDDRx specification. Similarly, the control signal Ctrl from the memory controller 310 may be provided to the memory device 320 by using at least one pin defined in the LPDDRx specification, such as LPDDR4 or LPDDR5.

According to an exemplary embodiment of the inventive concept, the duty monitor 322 may monitor the duty of the write clock WCK from at least one node in the memory device 320, and may store the monitoring information D_Info having a plurality of bits in the MRS 323. The memory device 320 may include one or more pins (for example, MRS pins) for storing information in the MRS 323 or reading information from the MRS 323 via communication with the memory controller 310, and the monitoring information D_Info read out from the MRS 323 may be provided to the memory controller 310 via the MRS pins.

The control signal Ctrl from the memory controller 310 may be provided to the MRS 323 of the memory device 320 via the MRS pins. For example, the control signal Ctrl may be stored in the MRS 323, and the control signal Ctrl may be read from the MRS 323 and provided to the duty adjuster 321. When the duty monitor 322 monitors the duty of the read clock RDQS, the monitoring information D_Info that results from monitoring the duty of the read clock RDQS may be stored in the MRS 323, and the monitoring information D_Info read from the MRS 323 may be provided to the memory controller 310 via the MRS pins.

Figure 4:
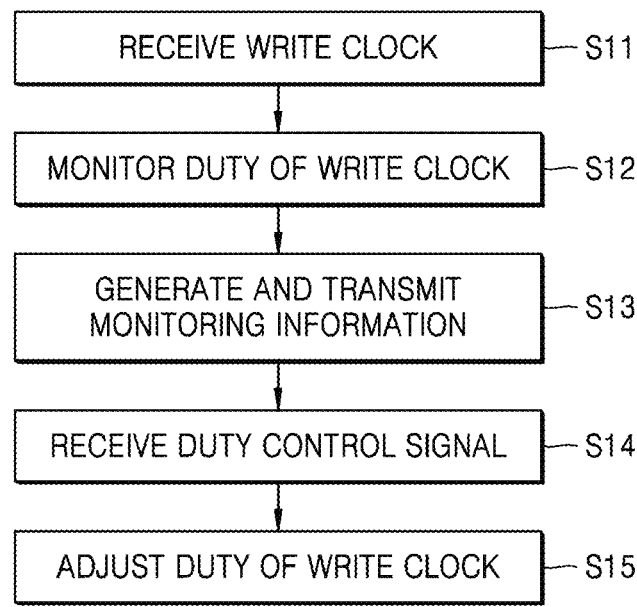
FIG. 4 is a flowchart of a method of operating a memory device, according to an exemplary embodiment of the inventive concept.

FIG. 4 is a flowchart of a method of operating a memory device, according to an exemplary embodiment of the inventive concept.

Referring to FIG. 4, in operation S11, the memory device may communicate with a memory controller, and may receive write data and a write clock that synchronizes with the write data, together with a write command from the memory controller. The memory device may include a data receiver and a write clock receiver, and the data receiver may receive the write data in synchronization with the write clock transmitted to the memory device.

The memory device may include a duty monitor according to the above-described exemplary embodiments. In operation S12, the duty monitor may monitor the duty of the write clock (for example, an internal write clock) output by the write clock receiver. For example, the write clock may be transmitted via various paths within the memory device, and the duty monitor may receive the write clock from nodes of one or more paths and monitor the duty of the write clock.

According to an exemplary embodiment of the inventive concept, in operation S13, the duty monitor may generate monitoring information having a digital value that varies according to a variation in the duty of the write clock, and the monitoring information generated by the duty monitor may be transmitted to the memory controller. The memory controller may determine a duty ratio of the write clock within the memory device, based on the monitoring information received from the memory device, and may also determine whether the duty of the write clock has an error (or whether the duty of the write clock needs to be adjusted). The memory controller may generate a duty control signal for adjusting the duty of the write clock within the memory device, based on the monitoring information.

The memory device includes a duty adjuster according to the above-described exemplary embodiments. In operation S14, the memory device may receive the duty control signal from the memory controller. In operation S15, the duty adjuster within the memory device may adjust the duty of the write clock in response to the duty control signal.

Figure 5:
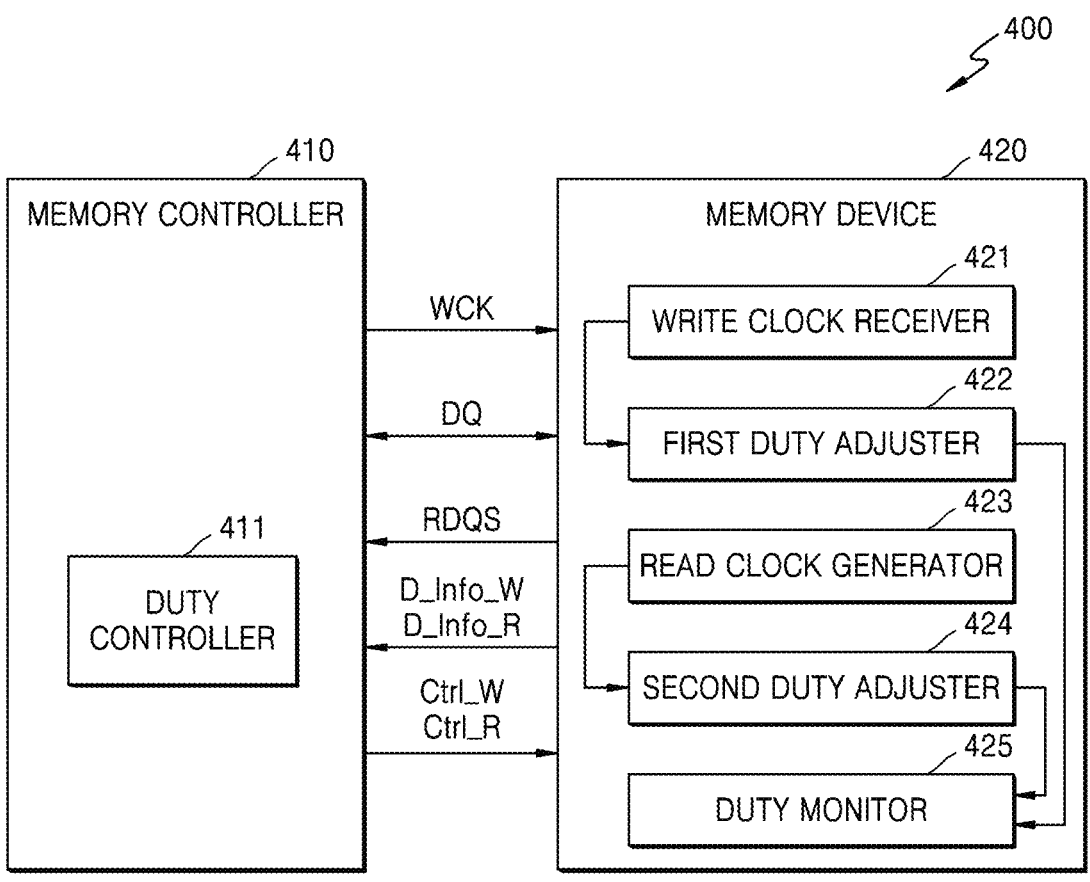
FIG. 5 is a block diagram of a memory system to which duty monitoring with respect to a read clock has been applied according to an exemplary embodiment of the inventive concept.

FIG. 5 is a block diagram of a memory system to which duty monitoring with respect to a read clock has been applied according to an exemplary embodiment of the inventive concept.

Referring to FIG. 5, a memory system 400 may include a memory controller 410 and a memory device 420, and the memory controller 410 may include a duty controller 411. The memory device 420 may include a write clock receiver 421, a first duty adjuster 422, a read clock generator 423, a second duty adjuster 424, and a duty monitor 425.

The memory controller 410 may provide the write data DQ and the write clock WCK, together with a data write command, to the memory device 420. The write clock receiver 421 may receive the write clock WCK and provide the received write clock WCK to the first duty adjuster 422. The write clock WCK output by the first duty adjuster 422 may be provided to a data receiver that receives the write data DQ. According to the above-described exemplary embodiments, the duty monitor 425 may monitor the duty of the write clock WCK output by the first duty adjuster 422 (or provided to the data receiver).

As the memory controller 410 provides a read command to the memory device 420, the memory device 420 may transmit, to the memory controller 410, the read data DQ and the read clock RDQS that synchronizes with the read data DQ. The read clock generator 423 may generate the read clock RDQS in various forms. According to an exemplary embodiment of the inventive concept, the read clock generator 423 may generate the read clock RDQS by using the write clock WCK. For example, the read clock generator 423 may include a clock tree that receives the write clock WCK, and the read clock RDQS from the read clock generator 423 may be provided to the second duty adjuster 424. The memory device 420 may further include a data transmitter that transmits the read data DQ, and the data transmitter may transmit the read data DQ to the memory controller 410 in synchronization with the read clock RDQS from the read clock generator 423 or the second duty adjuster 424.

According to an exemplary embodiment of the inventive concept, the duty monitor 425 may further generate a result of monitoring the duty of the read clock RDQS. For example, the duty monitor 425 may receive the read clock RDQS from the read clock generator 423 or the second duty adjuster 424, and may monitor the duty of the read clock RDQS to generate a monitoring result. Accordingly, the duty monitor 425 may provide both first monitoring information D_Info_W about the write clock WCK and second monitoring information D_Info_R about the read clock RDQS to the memory controller 410.

The duty controller 411 may output a first duty control signal Ctrl_W for adjusting the duty of the write clock WCK, based on the first monitoring information D_Info_W about the write clock WCK. The duty controller 411 may also output a second duty control signal Ctrl_R for adjusting the duty of the read clock RDQS, based on the second monitoring information D_Info_R about the read clock RDQS. The second duty adjuster 424 may adjust the duty of the read clock RDQS in response to the second duty control signal Ctrl_R.

According to such an exemplary embodiment of the inventive concept, when the memory controller 410 receives the read data DQ from the memory device 420, the duty of the read clock RDQS that synchronizes with the read data DQ does not need to be adjusted within the memory controller 410, and the memory controller 410 may receive the read clock RDQS having a duty optimized for reception of the read data DQ from the memory device 420.

For example, if data reception performance is optimized where the memory controller 410 receives the read clock RDQS in which a logic high section and a logic low section have a ratio of 50 to 50, even when the memory device 420 outputs the read clock RDQS having such an optimal duty ratio, the duty ratio of the read clock RDQS may be changed due to an influence of a channel between the memory controller 410 and the memory device 420. In this case, reception performance of the read data DQ of the memory controller 410 may be reduced.

However, according to an exemplary embodiment of the inventive concept, the memory device 420 may adjust the duty of the read clock RDQS, based on the second duty control signal Ctrl_R in which the influence of the channel has been reflected, and the memory controller 410 may receive the read data DQ in synchronization with the read clock RDQS having an optimized duty.

Figure 6:
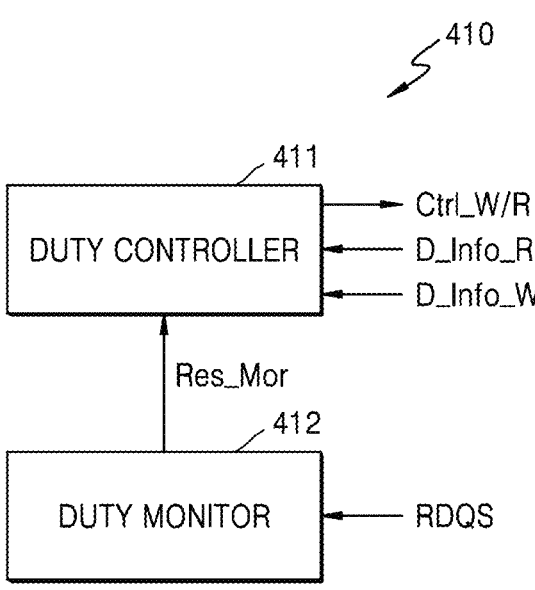
FIG. 6 is a block diagram illustrating a memory controller included in the memory system of FIG. 5 according to an exemplary embodiment of the inventive concept.

FIG. 6 is a block diagram illustrating a memory controller included in the memory system of FIG. 5 according to an exemplary embodiment of the inventive concept.

Referring to FIGS. 5 and 6, the memory controller 410 may include the duty controller 411 and a duty monitor 412. According to the above-described exemplary embodiment of the inventive concept, the duty controller 411 may output the first duty control signal Ctrl_W for adjusting the duty of the write clock WCK, and the second duty control signal Ctrl_R for adjusting the duty of the read clock RDQS.

The memory controller 410 may receive from the memory device 420 the read data DQ and the read clock RDQS synchronized with the read data DQ, and may latch the read data DQ in synchronization with the read clock RDQS. The duty monitor 412, for monitoring the duty of a clock signal as described above, may receive the read clock RDQS, and the duty of the read clock RDQS may be monitored in the memory controller 410.

The duty controller 411 may generate the second duty control signal Ctrl_R by using at least one of the second monitoring information D_Info_R from the memory device 420 and third monitoring information Res_Mor from the duty monitor 412. For example, the duty controller 411 may selectively use one of the second monitoring information D_Info_R and the third monitoring information Res_Mor, or may generate the second duty control signal Ctrl_R by using a combination of the second monitoring information D_Info_R and the third monitoring information Res_Mor. For example, when a duty error is determined from at least one of the second monitoring information D_Info_R and the third monitoring information Res_Mor, the duty of the read clock RDQS may be adjusted by outputting the second duty control signal Ctrl_R.

Figure 7:
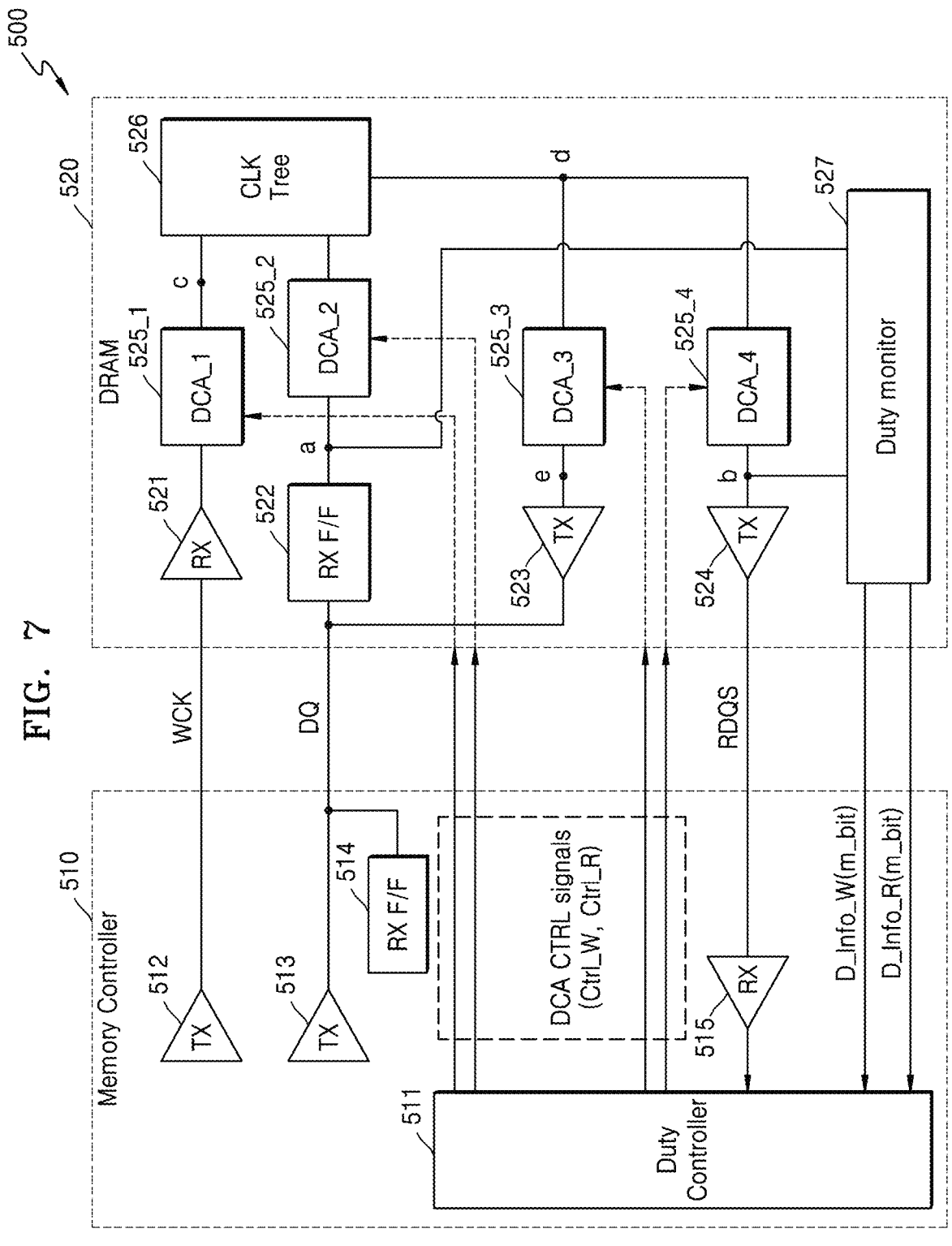
FIG. 7 is a block diagram of a memory system according to an exemplary embodiment of the inventive concept.

FIG. 7 is a block diagram of a memory system according to an exemplary embodiment of the inventive concept. FIG. 7 illustrates DRAM as a memory device as an example in which duty monitoring is performed on a write clock and a read clock.

Referring to FIG. 7, a memory system 500 may include a memory controller 510 and a memory device 520, and each of the memory controller 510 and the memory device 520 may include various components related with a memory operation. For example, the memory controller 510 may include a clock signal transmitter 512, a data transmitter 513, a data receiver 514, a read clock receiver 515, and a duty controller 511.

The memory device 520 may include a write clock receiver 521 for receiving the write clock WCK, a data receiver 522 for receiving the write data DQ, a data transmitter 523 for transmitting the read data DQ, and a read clock transmitter 524 for transmitting the read clock RDQS. When the memory device 520 receives the write data DQ having a plurality of bits in parallel, the data transmitter 513 of the memory controller 510 may include a plurality of transmission circuits, and the data receiver 522 of the memory device 520 may include a plurality of reception circuits. When the memory device 520 outputs the read data DQ having a plurality of bits in parallel, the data receiver 514 of the memory controller 510 may include a plurality of reception circuits, and the data transmitter 523 of the memory device 520 may include a plurality of transmission circuits.

The memory device 520 may further include one or more duty adjusters 525_1 through 525_4, a clock tree 526, and a duty monitor 527. In a same or similar manner as or to the above-described exemplary embodiments, each of the duty adjusters 525_1 through 525_4 may perform a duty adjust operation on a received clock signal in response to control signals Ctrl_W and Ctrl_R received from the memory controller 510. According to the above-described exemplary embodiments, the duty monitor 527 may monitor the duty of the clock signal that is applied to at least one node within the memory device 520, and generate monitoring information as a result of the monitoring. For example, the monitoring information may have a digital value of m bits (m_bit).

A data receiver included in each of the memory controller 510 and the memory device 520 may include a flip-flop that latches data DQ in synchronization with a clock signal. For example, the data receiver 514 of the memory controller 510 may latch the read data DQ in response to the read clock RDQS, and the data receiver 522 of the memory device 520 may latch the write data DQ in response to the write clock WCK.

According to an exemplary embodiment of the inventive concept, the duty adjusters 525_1 through 525_4 may be arranged in correspondence with the above-described various transmitters and receivers. For example, the duty adjusters 525_1 through 525_4 may include the duty adjuster 525_1 adjusting the duty of the write clock WCK output by the write clock receiver 521, the duty adjuster 525_2 adjusting the duty of the write clock WCK provided to the data receiver 522, the duty adjuster 525_3 adjusting the duty of the read clock RDQS provided to the data transmitter 523, and the duty adjuster 525_4 adjusting the duty of the read clock RDQS provided to the read clock transmitter 524. As described above, when each of the write data DQ and the read data DQ includes a plurality of bits, the duty adjuster 525_2 may include a plurality of duty adjusters in correspondence with the plurality of reception circuits, and the duty adjuster 525_3 may include a plurality of duty adjusters in correspondence with the plurality of transmission circuits.

The write clock WCK may be provided to the clock tree 526 and may be provided to various nodes within the memory device 520 via the clock tree 526. The duty monitor 527 may monitor the duties of the write clock WCK and the read clock RDQS via the various nodes within the memory device 520. For example, FIG. 7 illustrates an example in which the duty monitor 527 monitors the duty of the write clock WCK via a node a and monitors the duty of the read clock RDQS via a node b.

The write clock WCK may be provided to the data receiver 522 via the node a and may be used to latch the write data DQ. At this time, the duty monitor 527 may monitor the duty of the write clock WCK to provide the first monitoring information D_Info_W. For example, the first monitoring information D_Info_W may include m bits of information.

During a data read operation, a signal based on the write clock WCK may be provided as the read clock RDQS to the read clock transmitter 524 via the clock tree 526, and the read clock transmitter 524 may transmit the read clock RDQS to the memory controller 510. The duty monitor 527 may provide the second monitoring information D_Info_R including m bits of information by monitoring the duty of the read clock RDQS.

Although FIG. 7 illustrates an example in which the duties of the write clock WCK and the read clock RDQS are monitored via the nodes a and b, the inventive concept is not limited thereto. As described above, the duties of the write clock WCK and the read clock RDQS may be monitored via the various nodes within the memory device 520. For example, the duty of the write clock WCK output by the duty adjuster 525_1 may be monitored via a node c. For example, because the write clock WCK provided to the data receiver 522 to receive the write data DQ and the read clock RDQS provided to the data transmitter 523 to output the read data DQ may be generated from the clock tree 526, based on the write clock WCK output by the duty adjuster 525_1, a result of duty monitoring of the write clock WCK output by the duty adjuster 525_1 may be commonly used to adjust the duties of the write clock WCK and the read clock RDQS.

To monitor the duty of the read clock RDQS, the duty of the read clock RDQS output by the clock tree 526 via a node d may be monitored, or the duty of the read clock RDQS output by the duty adjuster 525_3 via a node e may be monitored.

The duty controller 511 of the memory controller 510 may detect duty errors of the write clock WCK and the read clock RDQS, based on received pieces of the monitoring information D_Info_W and D_Info_R, and may provide the control signal Ctrl for minimizing a duty error to the memory device 520. For example, the duty controller 511 may generate the first duty control signal Ctrl_W, based on the first monitoring information D_Info_W about the write clock WCK, and the first duty control signal Ctrl_W may be provided to duty adjusters (for example, 525_1 and 525_2) that adjust the duty of the write clock WCK.

The duty controller 511 may also generate the second duty control signal Ctrl_R, based on the second monitoring information D_Info_R about the read clock RDQS. For example, the duty controller 511 may generate the second duty control signal Ctrl_R by using the second monitoring information D_Info_R, and the second duty control signal Ctrl_R may be provided to duty adjusters (for example, 525_3 and 525_4) that adjust the duty of the read clock RDQS. Alternatively, as in the above-described embodiment of the inventive concept, the duty controller 511 may generate the second duty control signal Ctrl_R by directly monitoring the duty of the read clock RDQS. Alternatively, the duty controller 511 may generate the second duty control signal Ctrl_R, based on a combination of a result of autonomously monitoring the duty of the read clock RDQS with the second monitoring information D_Info_R provided by the memory device 520.

A duty monitoring operation according to an exemplary embodiment of the inventive concept may be performed in various ways without limiting the components of FIG. 7 to operations and configurations as described above. For example, monitoring may be performed via the various nodes within the memory device 520, and the duty adjusters 525_1 through 525_4 may be grouped in various ways and may perform a duty adjust operation. For example, the duty of a clock signal of a node corresponding to each of the duty adjusters 525_1 through 525_4 may be monitored, and, based on this, each of the duty adjusters 525_1 through 525_4 may perform a duty adjust operation in response to a separate control signal. Alternatively, the duty adjusters 525_1 through 525_4 may be grouped into duty adjusters (for example, 525_1 and 525_2) related with a data write operation and duty adjusters (for example, 525_3 and 525_4) related with a data read operation, the duty of a clock signal of a node corresponding to each group may be monitored, and each group of the duty adjusters 525_1 through 525_4 may perform a duty adjust operation.

Alternatively, because the write clock WCK is provided to the memory device 520 via the duty adjuster 525_1 as described above, the duty of only a clock signal of one node connected to the duty adjuster 525_1 may be monitored, and accordingly the memory device 520 may be realized in a form that controls a duty adjust operation of only the duty adjuster 525_1.

Figure 8:
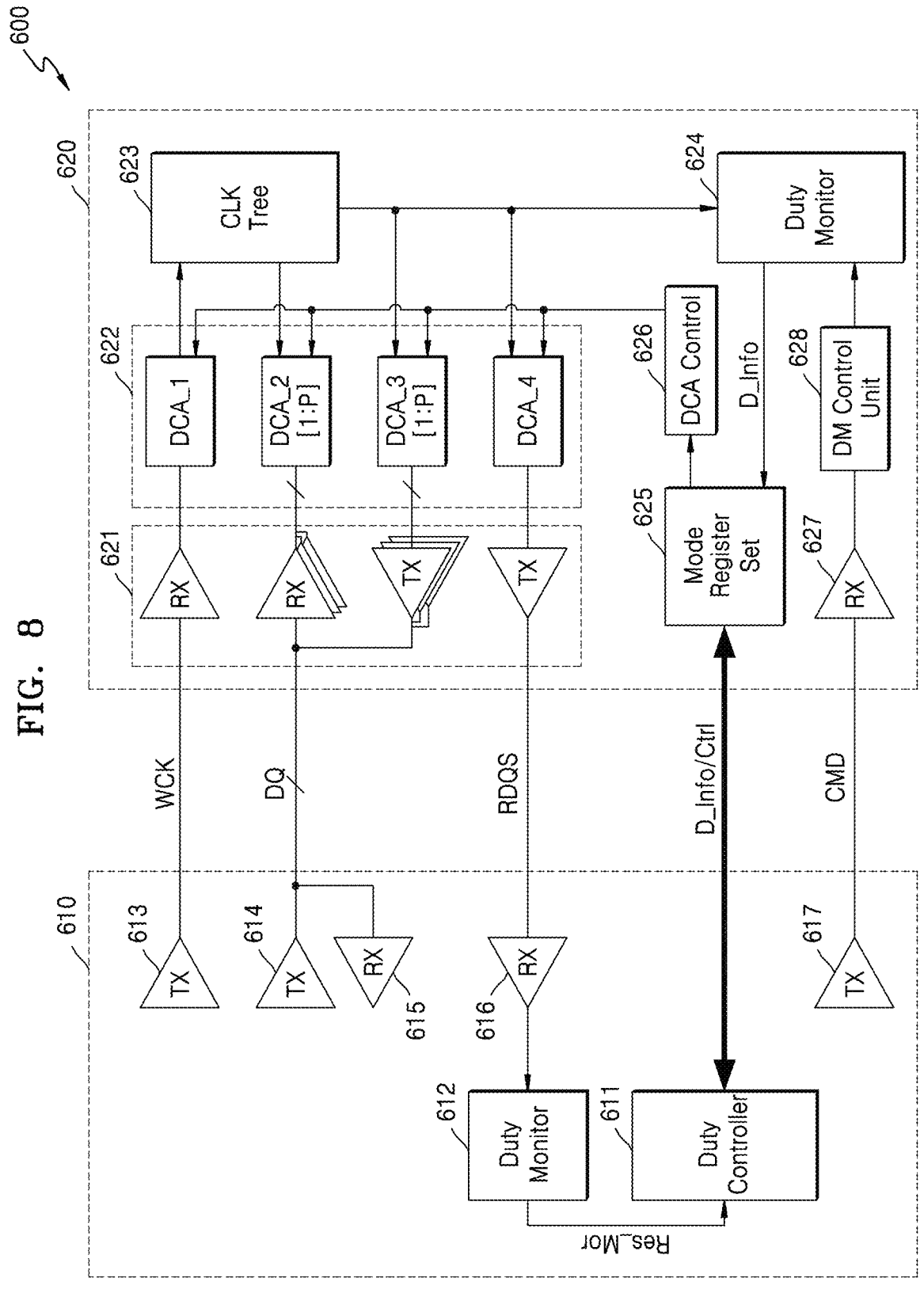
FIG. 8 is a block diagram of a memory system according to an exemplary embodiment of the inventive concept.

FIG. 8 is a block diagram of a memory system according to an exemplary embodiment of the inventive concept. FIG. 8 illustrates an example in which a memory controller controls a period and/or enabling of a duty monitoring operation. Detailed descriptions of components and operations of a memory system 600 of FIG. 8 that are the same as or similar to those given above with reference to the above-described exemplary embodiments will not be repeated herein.

Referring to FIG. 8, the memory system 600 may include a memory controller 610 and a memory device 620. The memory controller 610 may include a duty controller 611, a duty monitor 612, a clock signal transmitter 613, a data transmitter 614, a data receiver 615, a read clock receiver 616, and a command transmitter 617. The memory device 620 may include a signal transmission/reception block 621, a duty adjuster block 622, a clock tree 623, a duty monitor 624, an MRS 625, a duty adjuster controller 626, a command receiver 627, and a duty monitor controller 628. As described above in the above-described exemplary embodiment of the inventive concept, the signal transmission/reception block 621 may include a receiver that receives the write clock WCK, a receiver that receives the write data DQ, a transmitter that outputs the read data DQ, and a transmitter that outputs the read clock RDQS.

In the case that P bits of data DQ are transmitted or received in parallel, the receiver that receives the write data DQ may include P reception circuits, and the transmitter that outputs the read data DQ may include P transmission circuits. P duty adjusters DCA_2 [1:P] may be arranged in correspondence with the P reception circuits, and P duty adjusters DCA_3 [1:P] may be arranged in correspondence with the P transmission circuits. Although FIG. 8 illustrates an example in which the duty monitor 624 is connected to an output terminal of the clock tree 623 and performs monitoring, the duty monitor 624 may perform monitoring via various nodes within the memory device 620, as described above.

According to the above-described exemplary embodiments, the MRS 625 may store the monitoring information D_Info obtained by monitoring the duty of the write clock WCK and/or the duty of the read clock RDQS, and also store the control signal Ctrl provided by the memory controller 610. The duty adjuster controller 626 may control the duty adjuster block 622, based on the monitoring information D_Info read from the MRS 625, and the duty adjusters included in the duty adjuster block 622 may perform duty adjust operations under the control of the duty adjuster controller 626.

The memory controller 610 may determine whether a clock signal has an optimal duty, based on the monitoring information D_Info, and, according to a result of the determination, may output a control command CMD for controlling a monitoring operation and a duty adjust operation performed in the memory device 620. The duty monitor controller 628 may control an operation of the duty monitor 624, in response to the control command CMD. According to an exemplary embodiment of the inventive concept, the memory device 620 may include a command decoder for controlling a memory operation by decoding various types of commands from the memory controller 610, and the duty monitor controller 628 may be a component corresponding to the command decoder or may be included in the command decoder.

The duty monitor controller 628 may control an operation of the duty monitor 624 in response to the control command CMD according to various methods. For example, when the duty of the clock signal is appropriate for latching data, the duty monitor 624 may set a period of duty monitoring to be long or may disable the duty monitoring under the control of the duty monitor controller 628. The memory controller 610 may check the monitoring information D_Info stored in the MRS 625 according to a period longer than the set period, and may output the control signal Ctrl, based on the checked monitoring information D_Info. Alternatively, the memory controller 610 may enable a duty monitoring operation at a specific time point or an arbitrary time point after a duty monitoring operation in the memory device 620 is disabled, and may generate and output the control signal Ctrl according to the above-described exemplary embodiments.

Figure 9:
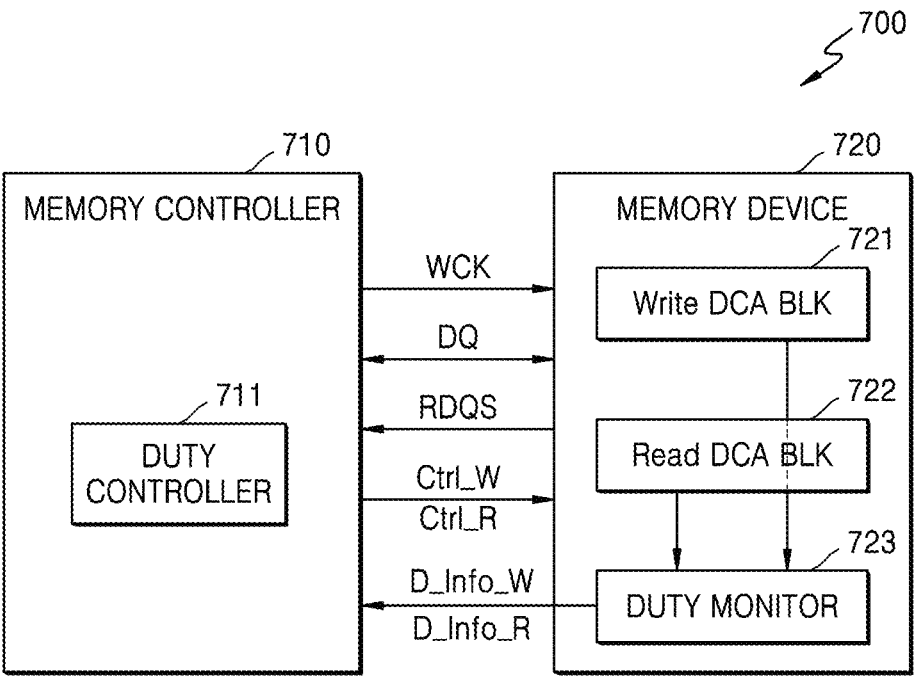
FIGS. 9 and 10 are block diagrams illustrating a memory system according to exemplary embodiments of the inventive concept.
Figure 10:
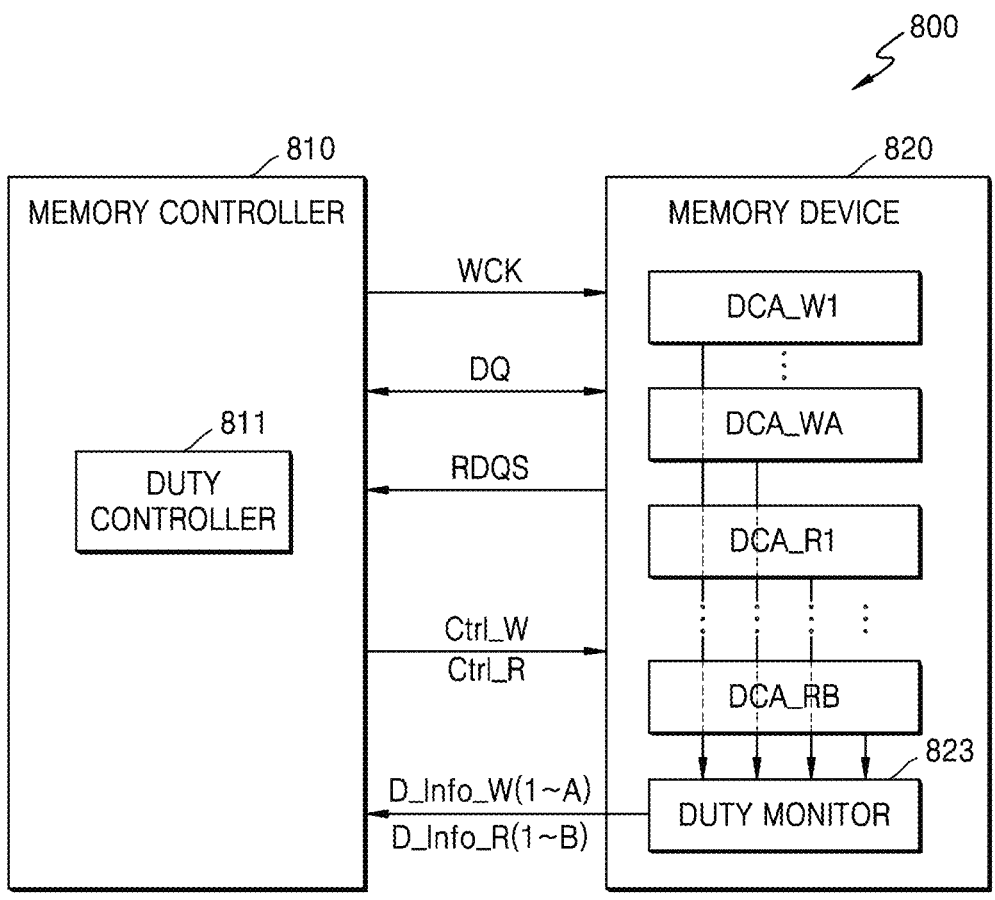

FIGS. 9 and 10 are block diagrams illustrating a memory system according to exemplary embodiments of the inventive concept.

Referring to FIG. 9, a memory system 700 may include a memory controller 710 and a memory device 720, and the memory controller 710 may include a duty controller 711. The memory device 720 may include a write duty adjuster block 721 including one or more duty adjusters for adjusting the duty of the write clock WCK, a read duty adjuster block 722 including one or more duty adjusters for adjusting the duty of the read clock RDQS, and a duty monitor 723. As described above, the write clock WCK may be provided to the memory device 720, the read clock RDQS may be provided to the memory controller 710, and data DQ may be exchanged between the memory controller 710 and the memory device 720.

A plurality of duty adjusters within the memory device 720 may be grouped into the write duty adjuster block 721 and the read duty adjuster block 722. The duty monitor 723 may monitor the duties of the write clock WCK and the read clock RDQS via nodes related with the write duty adjuster block 721 and the read duty adjuster block 722, generate the first monitoring information D_Info_W about the write clock WCK and the second monitoring information D_Info_R about the read clock RDQS, and provide the generated first monitoring information D_Info_W and the generated second monitoring information D_Info_R to the memory controller 710. The duty controller 711 may provide the above-described first duty control signal Ctrl_W and the above-described second duty control signal Ctrl_R to the memory device 720. A plurality of duty adjusters within the write duty adjuster block 721 may perform a duty adjust operation in response to the first duty control signal Ctrl_W, and a plurality of duty adjusters within the read duty adjuster block 722 may perform a duty adjust operation in response to the second duty control signal Ctrl_R.

Referring to FIG. 10, a memory system 800 may include a memory controller 810 and a memory device 820, wherein the memory controller 810 may include a duty controller 811 and the memory device 820 may include a plurality of (for example, A) write duty adjusters DCA_W1 through DCA_WA, a plurality of (for example, B) read duty adjusters DCA_R1 through DCA_RB, and a duty monitor 823.

The duty monitor 823 may monitor the duties of the write clock WCK and the read clock RDQS via a node (for example, a node connected to an output terminal of a duty adjuster) related with each of the write duty adjusters DCA_W1 through DCA_WA and the read duty adjusters DCA_R1 through DCA_RB, and generate monitoring information as a result of the monitoring. Accordingly, the monitoring information may include a plurality of pieces of first monitoring information D_Info_W(1~A) related with the A write duty adjusters DCA_W1 through DCA_WA and a plurality of pieces of second monitoring information D_Info_R(1~B) related with the B read duty adjusters DCA_R1 through DCA_RB. The duty controller 811 of the memory controller 810 may generate the first and second duty control signals Ctrl_W and Ctrl_R for controlling the write duty adjusters DCA_W1 through DCA_WA and the read duty adjusters DCA_R1 through DCA_RB, based on the pieces of the first and second monitoring information D_Info_W(1~A) and D_Info_R(1~B).

Figure 11:
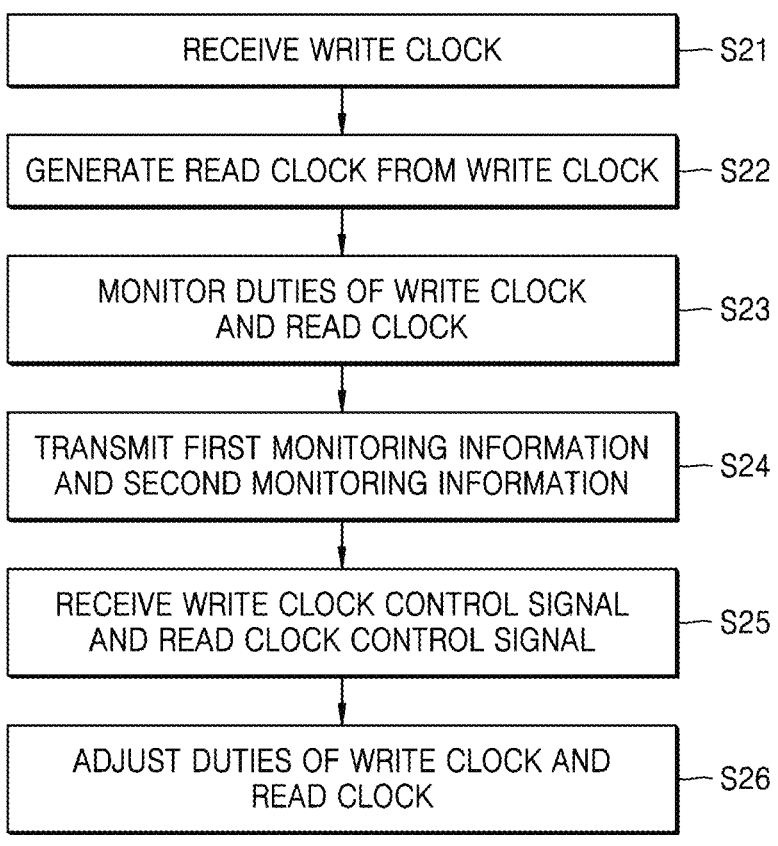
FIG. 11 is a flowchart of a method of operating a memory device, according to an exemplary embodiment of the inventive concept.

FIG. 11 is a flowchart of a method of operating a memory device, according to an exemplary embodiment of the inventive concept. FIG. 11 illustrates an example in which the memory device monitors the duties of a write clock and a read clock.

Referring to FIG. 11, in operation S21, the memory device may communicate with a memory controller, and may receive write data and a write clock that synchronizes with the write data from the memory controller, together with a write command from the memory controller. The memory device may generate various types of clock signals that are used therein, via processing with respect to the write clock. For example, in operation S22, the memory device may generate a read clock from the write clock.

The memory device may include a duty monitor that monitors the duty of the clock signal, and the duty monitor may receive the write clock and the read clock from at least some of various nodes in the memory device. In operation S23, the duty monitor may monitor the duties of the write clock and the read clock according to the above-described exemplary embodiments. In operation S24, the memory device may transmit, to the memory controller, first monitoring information obtained by monitoring the duty of the write clock, and second monitoring information obtained by monitoring the duty of the read clock. In operation S25, the memory device may receive, from the memory controller, a write clock control signal generated based on a first monitoring result and also a read clock control signal generated based on a second monitoring result. In operation S26, the memory device may include a duty adjuster according to the above-described exemplary embodiments, and the memory device may adjust the duties of the write clock and the read clock in response to the control signals received from the memory controller.

Figure 13A:
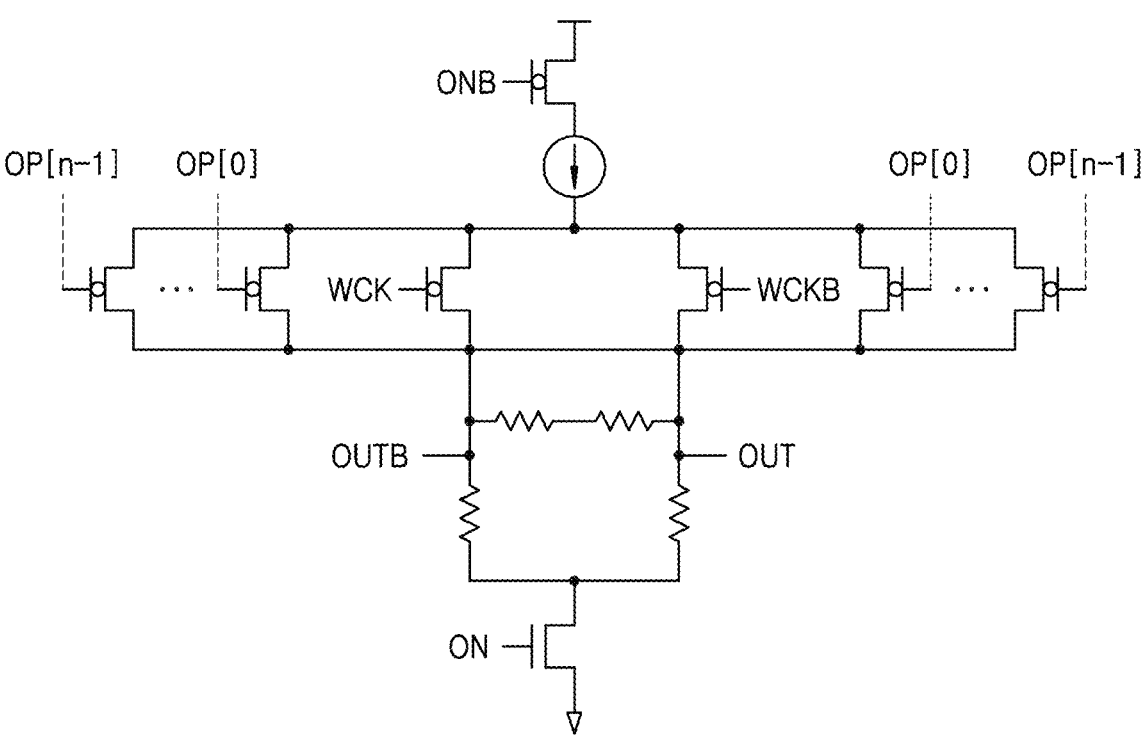
FIGS. 13A and 13B are circuit diagrams illustrating a duty adjuster that performs duty adjustment according to the information of FIG. 12 according to an exemplary embodiment of the inventive concept.
Figure 13B:
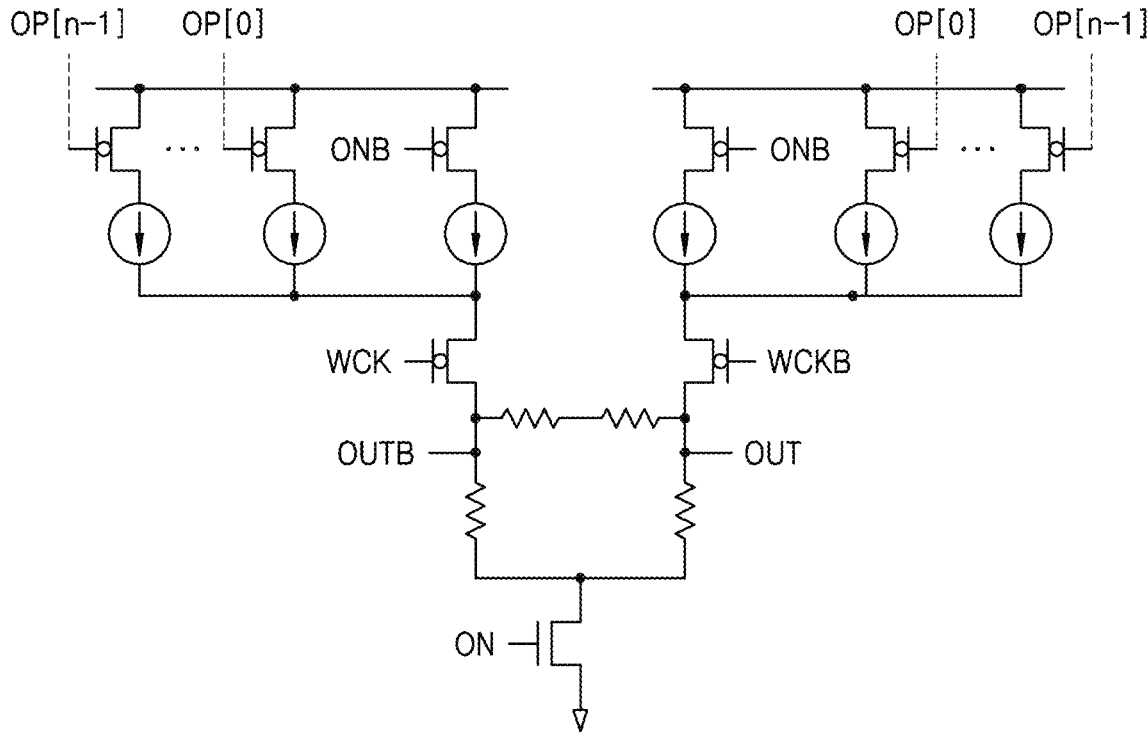

FIG. 12 is a table illustrating information stored in an MRS according to an exemplary embodiment of the inventive concept, and FIGS. 13A and 13B are circuit diagrams illustrating a duty adjuster that performs duty adjustment according to the information of FIG. 12 according to an exemplary embodiment of the inventive concept.

Referring to FIG. 12, the MRS may store duty monitoring information and a control signal in a plurality of fields OP[0] through OP[n+2]. For example, first fields OP[n+1] and OP[n+2] from among the plurality of fields OP[0] through OP[n+2] may store duty monitoring information according to the above-described exemplary embodiments, and the remaining second fields OP[0] through OP[n] may store a control signal according to the above-described exemplary embodiments.

For example, a duty monitor within a memory device may monitor the duty of a clock signal, such as a write clock and/or a read clock, and store monitoring information corresponding to two bits in the first fields OP[n+1] and OP[n+2]. For example, when a logic low section of the clock signal is greater than a logic high section thereof, a value of "1" may be stored in the field OP[n+2], and when the logic high section of the clock signal is greater than the logic low section thereof, a value of "1" may be stored in the field OP[n+1].

The memory controller may receive monitoring information of the first fields OP[n+1] and OP[n+2] and may generate a control signal corresponding to n bits, based on the received monitoring information. Because the control signal corresponding to n bits is able to control the amount of duty adjustment of the clock signal, the control signal may be referred to as a DCA weight. When the logic low section of the clock signal is greater than the logic high section thereof, the DCA weight may include control information for increasing the logic high section of the clock signal, and, when the logic high section of the clock signal is greater than the logic low section thereof, the DCA weight may include control information for increasing the logic low section of the clock signal. For example, at least one bit in the DCA weight may include polarity information representing whether to increase the duty of the logic high section or the duty of the logic low section. FIG. 12 illustrates an example in which the field OP[n] stores polarity information (DCA polarity).

FIGS. 13A and 13B illustrate an example in which the duty of the write clock WCK is adjusted. Referring to FIGS. 13A and 13B, the duty of the write clock WCK may be adjusted according to the DCA weight stored in the second fields OP[0] through OP[n] in various ways. For example, referring to FIG. 13A, the duty adjuster may include a plurality of transistors connected to one another in parallel, and switching of the plurality of transistors may be controlled according to the DCA weight. For example, FIG. 13A illustrates an example in which duty adjustment is performed due to adjustment of the size of a transistor according to the DCA weight.

As enable signals ON and ONB are activated, a duty adjust operation may be performed, and, as the size of a transistor through which a current passes is adjusted according to the DCA weight, the duty of the write clock WCK may be adjusted.

Referring to FIG. 13B, current sources may be arranged in correspondence with the plurality of transistors, and some of the plurality of transistors may be turned on according to the DCA weight. The amounts of current respectively flowing through output terminals OUT and OUTB may change according to turning-on states of the transistors, and accordingly the duty of the write clock WCK may be adjusted.

Figure 14:
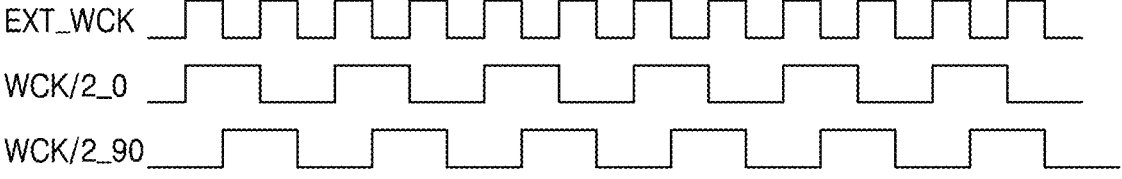
FIG. 14 is a waveform diagram illustrating clock signals that are used in a duty monitoring operation according to an exemplary embodiment of the inventive concept.
Figure 15:
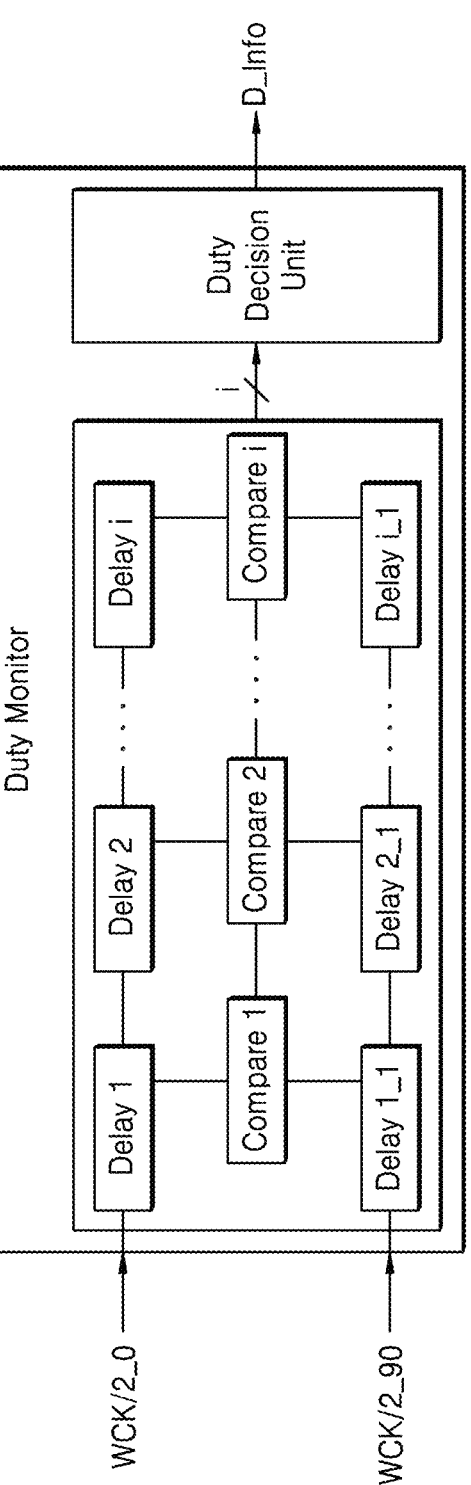
FIG. 15 is a block diagram of a duty monitor according to an exemplary embodiment of the inventive concept.

FIG. 14 is a waveform diagram illustrating clock signals that are used in a duty monitoring operation according to an exemplary embodiment of the inventive concept, and FIG. 15 is a block diagram of a duty monitor according to an exemplary embodiment of the inventive concept.

Referring to FIGS. 14 and 15, a write clock (for example, an external write clock EXT_WCK) provided by a memory controller may undergo an internal processing operation within a memory device, and at least one internal write clock may be generated from the external write clock EXT_WCK. FIG. 14 illustrates two internal write clocks WCK/2_0 and WCK/2_90, each having a frequency that is half of that of the external write clock EXT_WCK and having different phases from each other, and a write command of the memory controller may be latched using the internal write clocks WCK/2_0 and WCK/2_90.

Duty monitoring operations according to exemplary embodiments of the inventive concept may be performed using the internal write clocks WCK/2_0 and WCK/2_90. For example, the internal write clocks WCK/2_0 and WCK/2_90 may be provided to the duty monitor, and the duty monitor may include a plurality of delay circuits and a plurality of comparators. The internal write clocks WCK/2_0 and WCK/2_90 may be sequentially delayed via the plurality of delay circuits, and clock signals output via the delay circuits may be compared with one another.

For example, the duty of the external write clock EXT_WCK may be monitored by comparing logic states of the internal write clocks WCK/2_0 and WCK/2_90 with each other while adjusting delays of the internal write clocks WCK/2_0 and WCK/2_90. A comparison result when a logic high section of the external write clock EXT_WCK is greater than a logic low section thereof, and a comparison result when the logic low section is greater than the logic high section may have different values. A comparison result of i comparers may be provided to a duty decider, and the duty decider may generate the monitoring information D_Info according to the above-described exemplary embodiment by using the comparison result.

Figure 16:
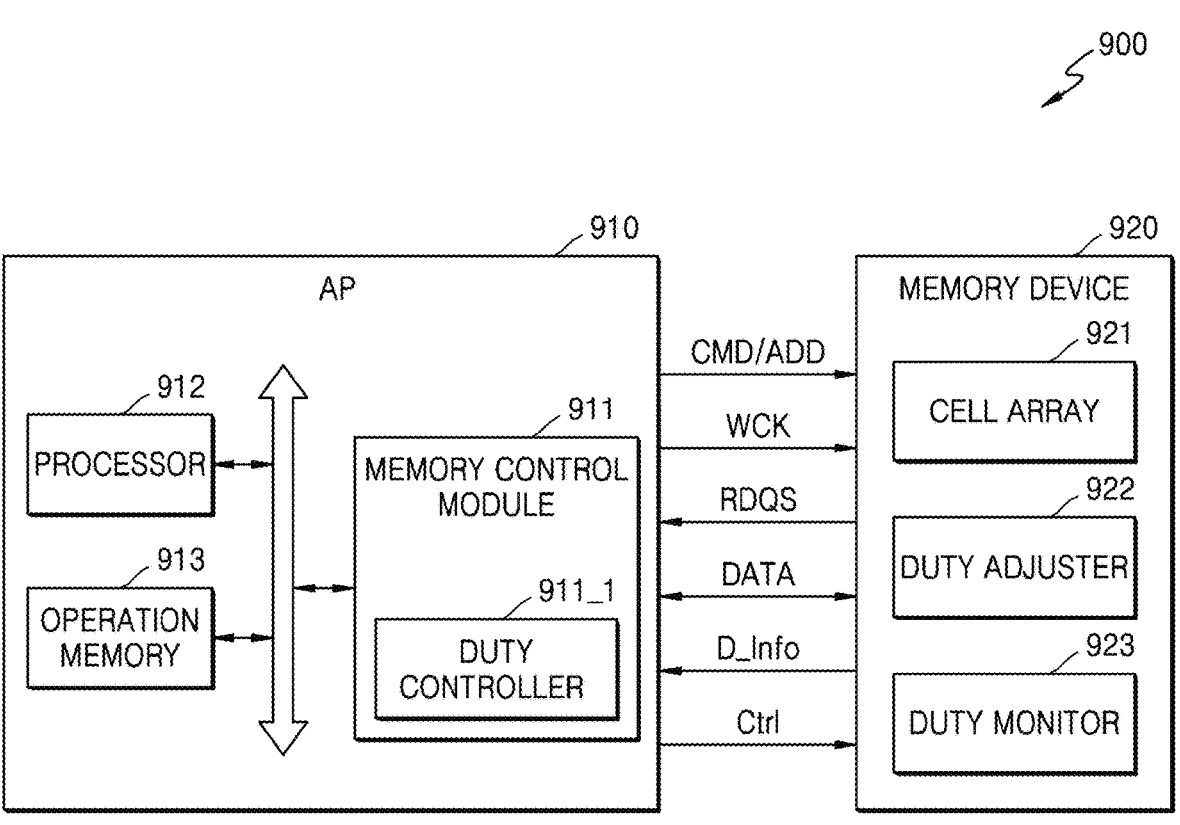
FIG. 16 is a block diagram of an electronic device including a memory system, according to an exemplary embodiment of the inventive concept.

FIG. 16 is a block diagram of an electronic device including a memory system, according to an exemplary embodiment of the inventive concept.

An electronic device 900 may correspond to a data processing system and may include an AP 910 and a memory device 920. The AP 910 may be implemented by using a system on chip (SoC). The SoC may include a system bus to which a protocol having a certain bus standard has been applied and may include various types of Intellectual Property (IP) devices that are connected to the system bus. An Advanced Microcontroller Bus Architecture (AMBA) protocol by Advanced RISC Machine (ARM) may be applied as a standard of the system bus. Examples of buses using the AMBA protocol may include an Advanced High-Performance Bus (AHB), an Advanced Peripheral Bus (APB), an Advanced extensible Interface (AXI), AXI4, and AXI Coherency Extensions (ACE). Besides them, other types of protocols, such as uNetwork by SONICs Inc., CoreConnect by IBM, and an Open Core Protocol by OCP-IP, are also applicable.

The AP 910 may include a memory control module 911, a processor 912 (such as, a central processing device), and an operation memory 913. Although FIG. 16 illustrates the single processor 912, the AP 910 may include various types of processors. The operation memory 913 may store instructions for controlling overall operations of the electronic device 900. The AP 910 may further include a modem processor as a component for controlling a modem communication function. In this case, the AP 910 may be referred to as ModAP.

According to the above-described exemplary embodiments, the memory control module 911 may include a duty controller 911_1, and the memory device 920 may include a cell array 921, a duty adjuster 922, and a duty monitor 923. The memory device 920 may perform the duty monitoring operations according to the above-described exemplary embodiments, and the duty monitor 923 may monitor the duty of the write clock WCK and/or the duty of the read clock RDQS, and generate the monitoring information D_Info as a result of the monitoring. According to the above-described exemplary embodiments, the memory control module 911 may generate the control signal Ctrl for optimizing the duty of a clock signal, based on the monitoring information D_Info, and the duty adjuster 922 of the memory device 920 may perform a duty adjust operation in response to the control signal Ctrl.

While the inventive concept has been particularly shown and described with reference to exemplary embodiments thereof, it will be understood by those of ordinary skill in the art that various changes in form and details may be made thereto without departing from the spirit and scope of the inventive concept as set forth by the following claims.

What is claimed is:

1. A method for performing a duty adjustment operation in a SDRAM device, the method comprising:

receiving, from an external device, a write clock and a control command;

generating an internal write clock based on the write clock;

performing a duty monitoring operation on the internal write clock in response to the control command for generating a duty monitoring information;

storing the duty monitoring information in a first mode register set (MRS);

transmitting the duty monitoring information to the external device;

receiving a duty control information which is generated based on the duty monitoring information;

storing the duty control information in a second MRS of the SDRAM device; and performing the duty adjustment operation on the internal write clock using the duty control information stored in the second MRS for generating a duty adjusted internal write clock, wherein the duty control information includes a polarity of a duty cycle adjustment which indicates whether to increase a portion of logic level high of the internal write clock or to increase a portion of logic level low of the internal write clock.

2. The method of claim 1, wherein the duty control information includes a duty cycle adjustment weight with which an amount of duty adjustment of the internal write clock is adjusted.

3. The method of claim 1, wherein the duty monitoring information comprises a first mode register set, and at least one field of the first mode register set indicates whether the logic high portion of the internal write clock is wider than the logic low portion of the internal write clock.

4. The method of claim 3, wherein the duty monitoring information indicates duty cycle error of the write clock, and is used for adjusting duty cycle error of the write clock.

5. The method of claim 4, wherein the duty control information includes a period of the duty monitoring operation of the SDRAM memory device based on the duty monitoring information.

6. The method of claim 5, wherein the duty control information increases the period of the duty monitoring operation when the duty monitoring information indicates that the duty cycle error of the write clock is within a predetermined range.

7. The method of claim 5, wherein the duty control information temporarily disables the duty monitoring operation when the duty monitoring information indicates that the duty cycle error of the write clock is within a predetermined range.

8. The method of claim 1, wherein transmitting the duty monitoring information is performed by a mode register set (MRS) read operation.

9. The method of claim 8, wherein the MRS read operation includes reading the first mode register set corresponding to the duty monitoring information.

10. The method of claim 9, wherein at least one field of the first mode register set indicates whether the logic high portion of an internal write clock generated from the write clock is wider than the logic low portion of the internal write clock.

11. A memory controller comprising:
   a plurality of data transmitters configured to generate write data to an external source;
   a write clock transmitter configured to generate a write clock to the external source in synchronization with the write data; and
   a duty controller configured to:
      receive, from the external source, first duty monitoring information which represents a result of monitoring a duty of the write clock, and generate a first duty control information based on the first duty monitoring information, the first duty control information being used to adjust a duty cycle of an internal write clock generated from the write clock; and
      receive, from the external source, second duty monitoring information which represents a result of monitoring a duty of a read clock generated based on the write clock, and generate a second duty control information based on the second duty monitoring information, the second duty control information being used to adjust the duty cycle of the read clock,
   wherein the first duty control information further includes a polarity of the duty cycle adjustment with which the memory controller decides whether to increase a portion of logic level high of the internal write clock or to increase a portion of logic level low of the internal write clock.

12. The memory controller of claim 11, wherein the first duty control information includes a duty cycle adjustment weight with which the external source controls amount of duty adjustment of the internal write clock.

13. The memory controller of claim 11, wherein the memory controller receives the first duty monitoring information from a first mode register set of the external source, and at least one field of the first mode register set indicates whether the logic high portion of the internal write clock is wider than the logic low portion of the internal write clock.

14. The memory controller of claim 11, wherein the memory controller controls a period of duty monitoring operation based on the first duty monitoring information.

15. The memory controller of claim 14, wherein the memory controller increases the period of the duty monitoring operation when the first duty monitoring information indicates that a duty cycle error of the write clock is within a predetermined range.

16. The memory controller of claim 14, wherein the memory controller temporarily disables the duty monitoring operation when the first duty monitoring information indicates that a duty cycle error of the write clock is within a predetermined range.

17. The memory controller of claim 11, wherein the memory controller is implemented in a system on chip (SoC).

18. The memory controller of claim 17, wherein the SoC comprises a plurality of processing units and a volatile memory.

19. The memory controller of claim 18, wherein the SoC further comprises a non-volatile memory.

20. The memory controller of claim 11, wherein the memory controller receives the first and second duty monitoring information through a mode register set (MRS) read operation.

* * * * *